US012250834B2

United States Patent
Lo et al.

(10) Patent No.: US 12,250,834 B2
(45) Date of Patent: Mar. 11, 2025

(54) POWER DEVICE AND MANUFACTURING METHOD THEREOF

(71) Applicant: Richtek Technology Corporation, Zhubei (TW)

(72) Inventors: Kuo-Hsuan Lo, Taoyuan (TW); Chien-Hao Huang, Penghu (TW); Chu-Feng Chen, Hsibchu (TW); Wu-Te Weng, Hsibchu (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 481 days.

(21) Appl. No.: 17/737,231

(22) Filed: May 5, 2022

(65) Prior Publication Data

US 2023/0046174 A1 Feb. 16, 2023

(30) Foreign Application Priority Data

Aug. 11, 2021 (TW) ................. 110129608

(51) Int. Cl.
| H01L 29/78 | (2006.01) |
| H01L 21/765 | (2006.01) |
| H10D 30/01 | (2025.01) |
| H10D 30/65 | (2025.01) |
| H10D 62/17 | (2025.01) |
| H10D 64/00 | (2025.01) |
| H10D 84/00 | (2025.01) |

(52) U.S. Cl.
CPC .......... *H10D 64/111* (2025.01); *H01L 21/765* (2013.01); *H10D 30/0281* (2025.01); *H10D 30/65* (2025.01); *H10D 62/393* (2025.01); *H10D 84/151* (2025.01); *H10D 30/0285* (2025.01)

(58) Field of Classification Search
None
See application file for complete search history.

(56) References Cited

U.S. PATENT DOCUMENTS

| 9,196,723 B1* | 11/2015 | Chen | .................. H01L 29/0623 |
| 2008/0242033 A1* | 10/2008 | Levin | .................. H01L 29/7835 |
| | | | 257/E21.345 |
| 2014/0015045 A1* | 1/2014 | Su | ........................ H01L 29/0886 |
| | | | 257/334 |
| 2015/0054076 A1 | 2/2015 | Zhang | |

(Continued)

OTHER PUBLICATIONS

Urone, et. al., College Physics, ch. 19.5, section "Dielectric"; https://pressbooks.online.ucf.edu/phy2053bc/chapter/capacitors-and-dielectrics/#:~:text=The%20capacitance%20of%20a%20parallel%20plate%20capacitor%20is%20C%3D%CE%B5,the%20permittivity%20of%20free%20space.&text=C%3D%CE%BA%CE%B50%20C%20%3D% (Year: 2016) 20%CE%BA%20%CE%B5%200%20Ad%2C&text=where%20%CE%BA%20is%20the%20dielectric%20constant%20of%20the%20material. (Year: 2016).*

*Primary Examiner* — Kretelia Graham
*Assistant Examiner* — William Henry Anderson
(74) *Attorney, Agent, or Firm* — Tung & Associates

(57) ABSTRACT

A power device includes: a semiconductor layer, a well region, a body region, a gate, a source, a drain, a first salicide block (SAB) layer and a second SAB layer. The first SAB layer is formed on a top surface of the semiconductor layer, and is located between the gate and the drain, wherein a part of the well is located vertically below and in contact with the first SAB layer. The second SAB layer is formed vertically above and in contact with the first SAB layer.

14 Claims, 8 Drawing Sheets

(56) References Cited

U.S. PATENT DOCUMENTS

2020/0105927 A1* 4/2020 Xu ..................... H01L 29/0882
2021/0367064 A1* 11/2021 Liu ..................... H01L 29/1095
2022/0344479 A1* 10/2022 Lee ................... H01L 29/42368

* cited by examiner

POWER DEVICE AND MANUFACTURING METHOD THEREOF

CROSS REFERENCE

The present invention claims priority to TW 110129608 filed on Aug. 11, 2021.

BACKGROUND OF THE INVENTION

Field of Invention

The present invention relates to a power device and a manufacturing method of the power device; particularly, it relates to such power device having enhanced breakdown voltage and a manufacturing method thereof.

Description of Related Art

Please refer to FIG. 1, which shows a schematic diagram of a cross-section view of a conventional power device 100 and conventional metal oxide semiconductor (MOS) devices 100a and 100b. A power device, in the context of this invention, refers to a semiconductor device operating to transmit power, whose drain, when implemented by a metal-oxide-semiconductor field effect transistor (MOSFET), is typically required to receive a voltage which is higher than 5V during normal operation. Generally, a drift region 12a (as indicated by a dashed frame in FIG. 1) is located between a drain 19 and a gate 17 of the power device 100. The drift region 12a serves to separate the drain 19 from a body region 16. A lateral length of the drift region 12a is determined according to an operation voltage that the power device 100 is required to withstand in normal operation. As shown in FIG. 1, the power device 100 comprises: a well 12, an isolation structure 13, a block layer 14, a body region 15, the gate 17, a source 18 and the drain 19.

The well 12 has N conductivity type and is formed on a substrate 11. As shown in FIG. 1, the substrate 11 has a high voltage region 13a and a low voltage region 13b. The well 12 in the high voltage region 13a and the well 12 in the low voltage region 13b are formed by one same process step. The gate 17 in the high voltage region 13a and the gate 17 in the low voltage region 13b are formed by one same process step. The block layer 14 in the high voltage region 13a and the block layer 14 in the low voltage region 13b are formed by one same process step. The power device 100 wherein a voltage applied to the drain thereof in normal operation is higher than 5V is formed in the high voltage region 13a, whereas, the MOS devices 100a and 100b wherein a voltage applied to the drain thereof in normal operation is not higher than 5V are formed in the low voltage region 13b. The MOS devices 100a and 100b are illustrated by the gates and the block layer 14 in FIG. 1; the rest parts of the MOS devices 100a and 100b, such as sources and drains are omitted in FIG. 1. The isolation structure 33 is a local oxidation of silicon (LOCOS) structure as shown in FIG. 1, for defining a device region, which is an active region for the operation of the power device 100.

There are metal layers to be formed after forming the gates, and in order to block such metal layers from undesirably contacting a region directly, such as directly contacting a part of the well 12, the block layer 14 in the high voltage region 13a and the block layer 14 in the low voltage region 13b are formed, and these block layers are formed by one same process step. In the power device 100, the thickness of the block layer 14 will limit a breakdown voltage of the power device 100. However, for the MOS devices 100a and 100b in the low voltage region 13b, because the size of the MOS devices 100a and 100b is reduced, the gap between the MOS device 100a and the MOS device 100b is relatively smaller, as compared to the gap between two neighboring power devices 100 in the high voltage region 13a. Thus, the thickness of the block layer 14 for the MOS device 100a and the MOS device 100b in the low voltage region 13b is limited, which correspondingly decides the thickness of the block layer 14 for the power device 100 in the high voltage region 13a, whereby the breakdown protection voltage of the power device 100 is restricted, and an application scope of the power device 100 is accordingly limited. The withstand voltage of the power device 100 can be enhanced by increasing the thickness of the block layer 14, but if the thickness of the block layer 14 for the MOS device 100a and the MOS device 100b is increased, the block layer 14 may expand to unwanted area.

In view of the above, to overcome the drawbacks in the prior art, the present invention proposes a power device and a manufacturing method thereof, which are capable of enhancing the breakdown voltage of the power device when the power device is in an OFF operation.

SUMMARY OF THE INVENTION

From one perspective, the present invention provides a power device, comprising: a semiconductor layer, which is formed on a substrate, and has a top surface; a well having a first conductivity type, which is formed in the semiconductor layer, wherein the well is located below and in contact with the top surface; a body region having a second conductivity type, which is formed in the semiconductor layer, wherein the body region is located below and in contact with the top surface, and wherein the body region is in contact with the well in a channel direction; a gate, which is formed on the top surface, wherein a part of the body region is located vertically below and in contact with the gate, to serve as an inversion current channel in an ON operation of the power device, and wherein a part of the well which is in contact with the body region is located vertically below the gate, to serve as a drift current channel in the ON operation of the power device; a source and a drain having the first conductivity type, which are formed below and in contact with the top surface, wherein the source and the drain are located below and outside two sides of the gate respectively, wherein the side of the gate which is closer to the source is a source side and the side of the gate which is closer to the drain is a drain side, and wherein the source is located in the body region, and the drain is located in the well outside the drain side; a first salicide block (SAB) layer, which is formed on the top surface and which is located between the gate and the drain, wherein a part of the well is located vertically below and in contact with the first SAB layer; and a second SAB layer, which is formed vertically above and in contact with the first SAB layer.

From another perspective, the present invention provides a manufacturing method of the power device, comprising: forming a semiconductor layer on a substrate, wherein the semiconductor layer has a top surface; forming a well in the semiconductor layer, wherein the well has a first conductivity type, wherein the well is located below and in contact with the top surface; forming a body region in the semiconductor layer, wherein the body region has a second conductivity type, wherein the body region is located below and in contact with the top surface, and wherein the body region is in contact with the well in a channel direction; forming a gate on the top surface, wherein a part of the body region is located vertically below and in contact with the gate, to serve as an inversion current channel in an ON operation of the power device, and wherein a part of the well which is in contact with the body region is located vertically below the gate, to serve as a drift current channel in the ON operation of the power device; forming a source and a drain below and in contact with the top surface, wherein each of the source and the drain has the first conductivity type, wherein the source and the drain are located below and outside two sides of the gate respectively, wherein the side of the gate which is closer to the source is a source side and the side of the gate which is closer to the drain is a drain side, and wherein the source is located in the body region, and the drain is located in the well outside the drain side; forming a first SAB layer on the top surface, wherein the first SAB layer is located between the gate and the drain, wherein a part of the well is located vertically below and in contact with the first SAB layer; and forming a second SAB layer vertically above and in contact with the first SAB layer.

In one embodiment, the power device further comprises: a salicide layer which is conductive, which is formed on and in contact with the second SAB layer, wherein the salicide layer serves to be electrically connected to a predetermined voltage level, so as to relieve an electric field distribution during operation of the power device.

In one embodiment, the power device is a laterally diffused metal oxide semiconductor (LDMOS) device.

In one embodiment, a composite layer of the first SAB layer superimposed with the second SAB layer has a dielectric constant lower than 3.9.

In one embodiment, a composite layer of the first SAB layer superimposed with the second SAB layer has a dielectric constant higher than 3.9.

In one embodiment, a composite layer of the first SAB layer superimposed with the second SAB layer has a dielectric constant equal to 3.9.

In one embodiment, the substrate has a low voltage region and a high voltage region, wherein the power device is formed in the high voltage region; wherein a plurality of metal oxide semiconductor (MOS) devices are formed in the low voltage region; wherein the first SAB layer is formed in the low voltage region and the high voltage region; and wherein the second SAB layer is formed in the high voltage region and is not located in the low voltage region.

In one embodiment, a thickness of second SAB layer is determined according to a required OFF breakdown voltage of the power device.

The present invention has an advantage that the OFF breakdown voltage of the power device is enhanced.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations among the process steps and the layers, while the shapes, thicknesses, and widths are not drawn in actual scale.

Figure 1:
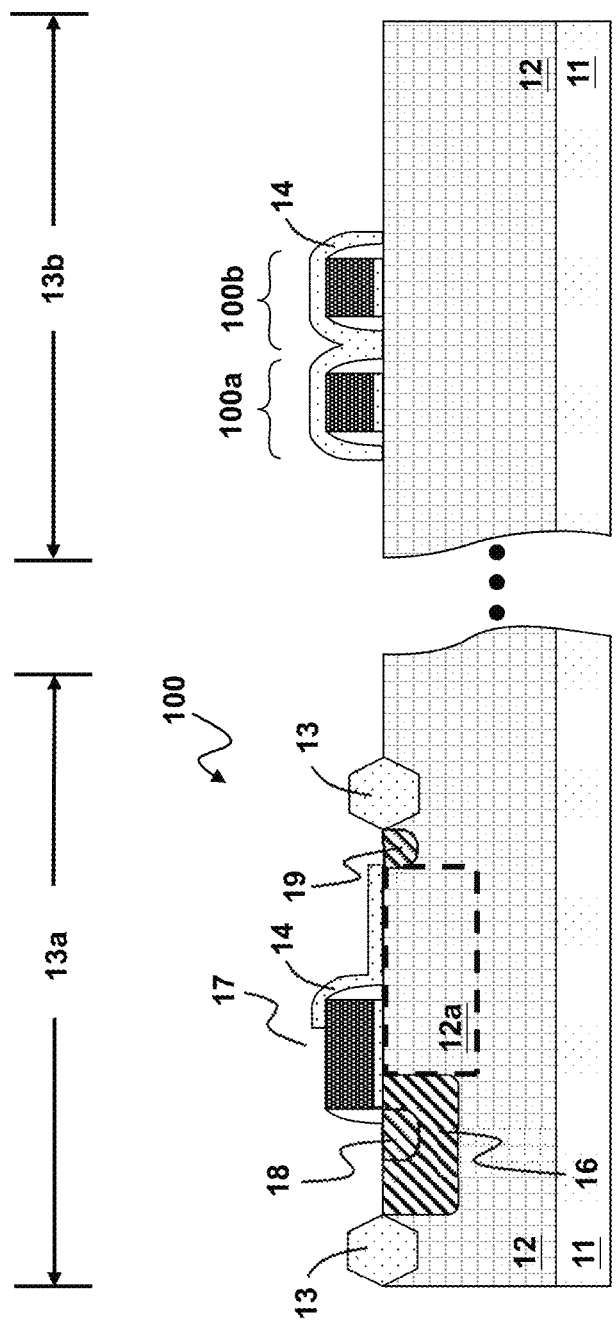
FIG. 1 shows a schematic diagram of a cross-section view of a conventional power device and conventional metal oxide semiconductor (MOS) devices.
Figure 2:
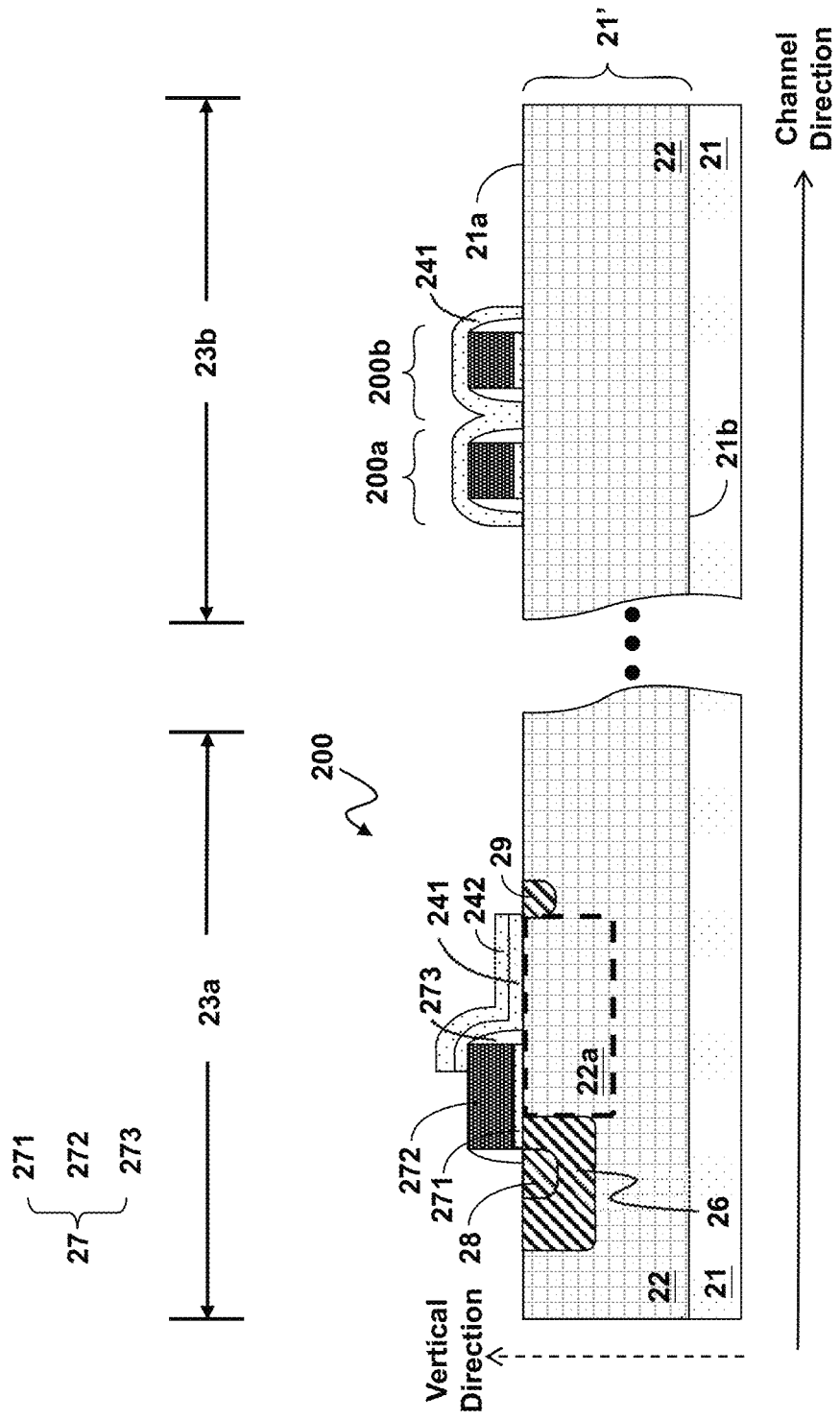
FIG. 2 shows a schematic diagram of a cross-section view of a power device and MOS devices according to an embodiment of the present invention.

Please refer to FIG. 2, shows a schematic diagram of a cross-section view of a power device 200 and metal oxide semiconductor (MOS) devices 200*a* and 200*b* according to an embodiment of the present invention. As shown in FIG. 2, the power device 200 includes: a well 22, a first salicide block (SAB) layer 241, a second SAB layer 242, a body region 26, a gate 27, a source 28 and a drain 29. "Salicide" is a term commonly used in this field to refer to "self-aligned sicilide".

The well 22 has a first conductivity type and is formed on a substrate 21. As shown in FIG. 2, the substrate 21 has a high voltage region 23*a* and a low voltage region 23*b*. The well 22 in the high voltage region 23*a* and the well 22 in the low voltage region 23*b* are formed by one same process step. The gate 27 in the high voltage region 23*a* and the gate 12 in the low voltage region 23*b* are formed by one same process step. The first SAB layer 241 in the high voltage region 23*a* and the first SAB layer 241 in the low voltage region 23*b* are formed by one same process step. The power device 200 wherein a voltage applied to the drain thereof in normal operation is higher than 5V is formed in the high voltage region 23*a*, whereas, the MOS devices 200*a* and 200*b* wherein a voltage applied to the drain thereof in normal operation is not higher than 5V are formed in the low voltage region 23*b*. The MOS devices 200*a* and 200*b* are illustrated as shown by gates and the first SAB layer 241 in FIG. 2. The rest part of the MOS devices 200*a* and 200*b*, such as sources and drains are omitted in FIG. 2.

There are metal layers to be formed after forming the gates, and in order to block such metal layers from undesirably contacting a region directly, such as directly contacting a part of the well 22, the first SAB layer 241 in the high voltage region 13*a* and the first SAB layer 241 in the low voltage region 13*b* are formed, and these first SAB layers 241 are formed by one same process step. The second SAB layer 242 is only formed in the high voltage region 23*a* and is not formed in the low voltage region 23*b*. The second SAB layer 242 is formed vertically above and in contact with the first SAB layer 241.

Figure 3:
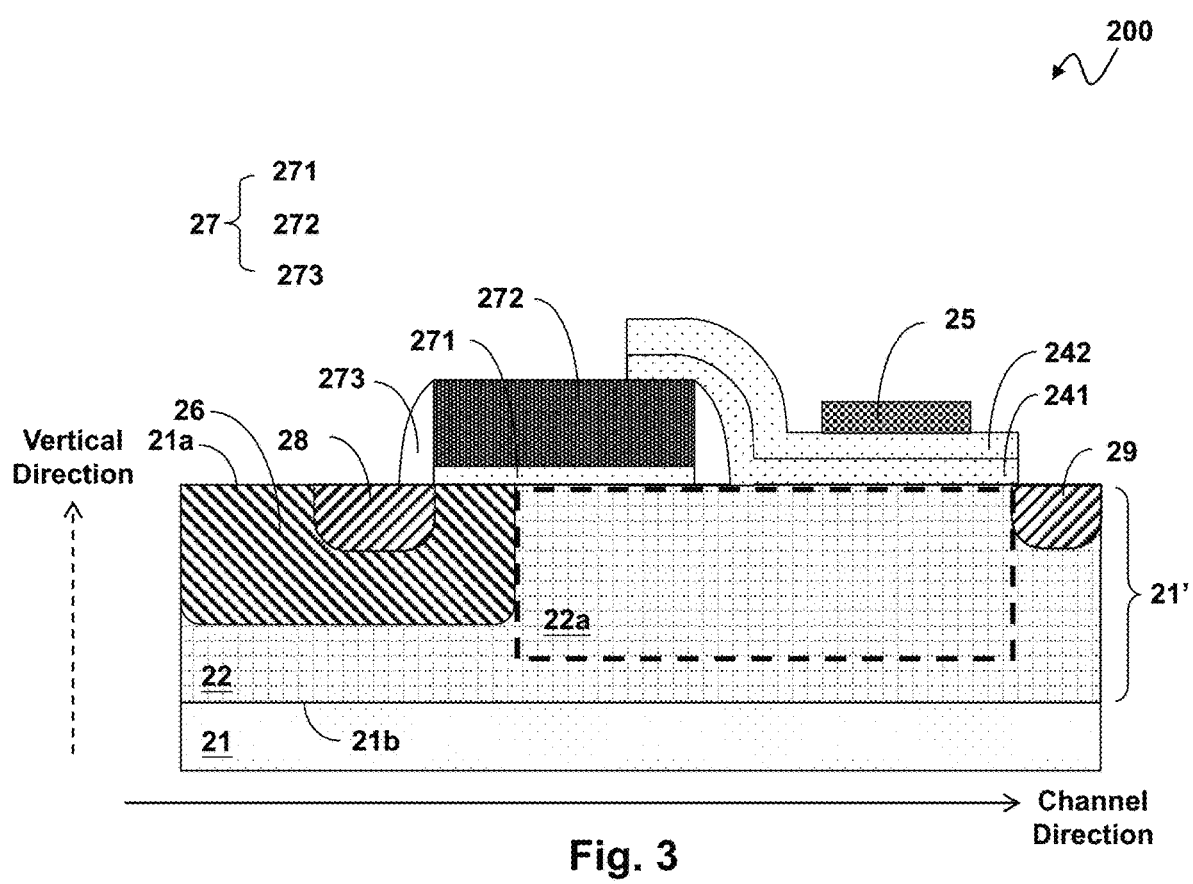
FIG. 3 shows a schematic diagram of a cross-section view of a power device according to an embodiment of the present invention.

As shown in FIG. 3, the power device 200 includes: a semiconductor layer 21', the well 22, the first SAB layer 241, the second SAB layer 242, the body region 26, the gate 27, the source 28 and the drain 29. The semiconductor layer 21' is formed on the substrate 21. Each of the well 22, the source 28 and the drain 29 has a first conductivity type. The body region 26 has a second conductivity type. The power device 200 can be for example a laterally diffused metal oxide semiconductor (LDMOS) device, as shown in FIG. 3. The power device according to the present invention can be applied in for example a power stage circuit in a switching power regulator circuit, which is well known to those skilled in the art, so the details thereof are not redundantly explained here.

The semiconductor layer 21' is formed on the substrate 21, and the semiconductor layer 21' has a top surface 21a and a bottom surface 21b that is opposite to the top surface 21a in a vertical direction (as indicated by the direction of the dashed arrow in FIG. 3). The substrate 21 is, for example but not limited to, a P conductivity type or an N conductivity type silicon substrate. The semiconductor layer 21', for example, is formed on the substrate 21 by an epitaxial growth process step, or, a part of the substrate 21 is used as the semiconductor layer 21'. The semiconductor layer 21' can be formed by any method known to a person having ordinary skill in the art, so the details thereof are not redundantly explained here.

Still referring to FIG. 3, the well 22 has a first conductivity type, and is formed in the semiconductor layer 21'. The well 22 is located below and in contact with the top surface 21a. The body region 26 has a second conductivity type, and is formed in the semiconductor layer 21'. The body region 26 is located below and in contact with the top surface 21a. The body region 26 is in contact with the well 22 in a channel direction (as indicated by the direction of the solid arrow in FIG. 3). The gate 27 is formed on the top surface 21a. A part of the body region 26 is located vertically below and in contact with the gate 27, to serve as an inversion current channel in an ON operation of the power device 200. And, a part of the well 22 which is in contact with the body region 26 is located vertically below the gate 27, to serve as a drift current channel (as indicated by the thick dashed frame in FIG. 3) in the ON operation of the power device 200. Each of the source 28 and the drain 29 has the first conductivity type, and is formed below and in contact with the top surface 21a. The source 28 and the drain 29 are located below and outside two sides of the gate 27 respectively. The side of the gate 27 which is closer to the source 28 is a source side and the side of the gate 27 which is closer to the drain 29 is a drain side, wherein the source 28 is located in the body region 26, and the drain 29 is located in the well 22 outside the drain side.

Still referring to FIG. 3, the first SAB layer 241 is formed on the top surface 21a and is located between the gate 27 and the drain 29, wherein a part of the well 22 is located vertically below and in contact with the first SAB layer 241. The second SAB layer 242 is formed vertically above and in contact with the first SAB layer 241. In one embodiment, a thickness of the second SAB layer 242 is greater than a thickness of the first SAB layer 241. In one embodiment, the second SAB layer 242 has plural layers. In one embodiment, a composite layer of the first SAB layer 241 superimposed with the second SAB layer 242 has a dielectric constant lower than 3.9. In another embodiment, a composite layer of the first SAB layer 241 superimposed with the second SAB layer 242 has a dielectric constant higher than 3.9. In still another embodiment, a composite layer of the first SAB layer 241 superimposed with the second SAB layer 242 has a dielectric constant equal to 3.9. In one embodiment, the thickness of second SAB layer 242 is determined according to the required OFF breakdown voltage of the power device 200.

As shown in FIG. 3, the salicide layer 25 which is conductive is formed on and in contact with the second SAB layer 242. The salicide layer 25 serves to be electrically connected to a predetermined voltage level, so as to relieve an electric field distribution during operation of the power device 200 and so as to optimize a withstand voltage thereof.

In one embodiment, the material of the salicide layer 25 for example can be doped polysilicon, or a compound of silicon and metal, such as but not limited to tungsten silicide, cobalt silicide, titanium silicide, nickel silicide, etc.

Note that the gate 27 includes a dielectric layer 271 in contact with the top surface 21a, a conductive layer 272 on the dielectric layer 271, and a spacer layer 273 having electrical insulation properties. The gate 27 turns ON and turns OFF the power device 200 according to a control signal applied to the gate 27.

Still referring to FIG. 3, a drift region 22a is formed in the well 22 between the drain 29 and the body region 26 in the channel direction, and is in contact with the top surface 21a, to separate the drain 29 from the body region 26 and to serve as a drift current channel in the ON operation of the power device 200.

Note that the term "inversion current channel" means thus. Taking this embodiment as an example, when the power device 200 operates in ON operation due to the voltage applied to the gate 27, an inversion layer is formed below the gate 27, so that a conduction current flows through the region of the inversion layer, which is the inverse current channel known to a person having ordinary skill in the art.

Note that the term "drift current channel" means thus. Taking this embodiment as an example, the drift current channel refers to a region where the conduction current passes through in a drifting manner when the power device 200 operates in ON operation, which is known to a person having ordinary skill in the art.

Note that the top surface 21a as referred to does not mean a completely flat plane but refers to the surface of the semiconductor layer 21'.

Note that the above-mentioned "first conductivity type" and "second conductivity type" mean that impurities of corresponding conductivity types are doped in regions of the power device (for example but not limited to the aforementioned well region, body region, source and drain, etc.), so that the regions have the corresponding conductivity types. For example, the first conductivity type is N-type and the second conductivity type is P-type, or the first conductivity type is P-type and the second conductivity type is N-type. The first conductivity type has a conductivity type opposite to a conductivity type of the second conductivity type.

In addition, a power device, in the context of this invention, refers to a semiconductor device operating to transmit power, whose drain, when implemented by a metal-oxide-semiconductor field effect transistor (MOSFET), is typically required to receive a voltage which is higher than 5V during normal operation. A lateral distance (length of the drift region) between the body region 26 and the drain 29 of the power device 200 is determined according to the required operation voltage during normal operation, so that the device can operate at or higher than the aforementioned specific voltage, which is known to a person having ordinary skill in the art, so the details thereof are not redundantly explained here.

Figure 4:
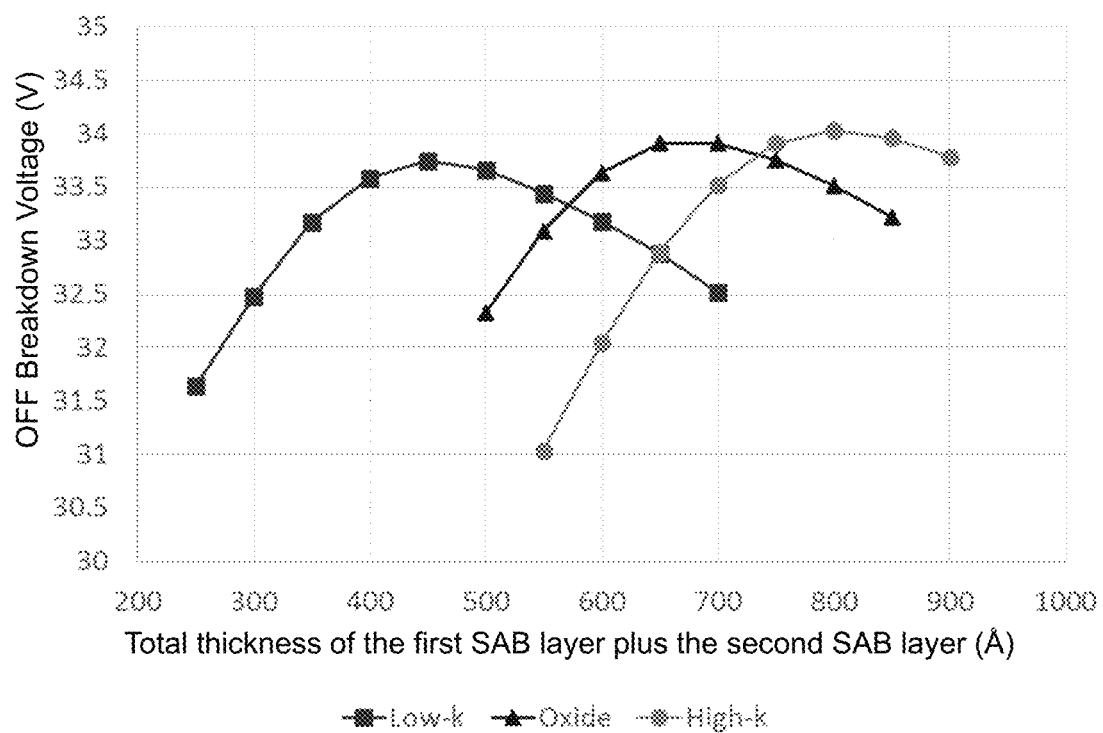
FIG. 4 shows an electrical characteristic chart depicting the relationship between a total thickness of the first SAB layer plus the second SAB layer and the OFF breakdown voltage of the power device.

Please refer to FIG. 4, which shows an electrical characteristic diagram depicting the relationship between a total thickness of the first SAB layer plus the second SAB layer and the OFF breakdown voltage of the power device. As shown in FIG. 4, in the embodiment wherein a composite layer of the first SAB layer 241 superimposed with the second SAB layer 242 has a dielectric constant lower than 3.9, when a total thickness of the first SAB layer 241 plus the second SAB layer 242 is approximately equal to 450 Å (angstrom), an optimal OFF breakdown voltage is obtained. In the embodiment wherein a composite layer of the first SAB layer 241 superimposed with the second SAB layer 242 has a dielectric constant equal to 3.9, when a total thickness of the first SAB layer 241 plus the second SAB layer 242 is approximately equal to 650 Å, an optimal OFF breakdown voltage is obtained. In the embodiment wherein a composite layer of the first SAB layer 241 superimposed with the second SAB layer 242 has a dielectric constant higher than 3.9, when a total thickness of the first SAB layer 241 plus the a second SAB layer 242 is approximately equal to 800 Å, an optimal OFF breakdown voltage is obtained. According to the present invention, the material and the thickness of the second SAB layer 242 can be selected or adjusted according to the dielectric constant to obtain the optimal OFF breakdown voltage.

Figures 5A, 5B:
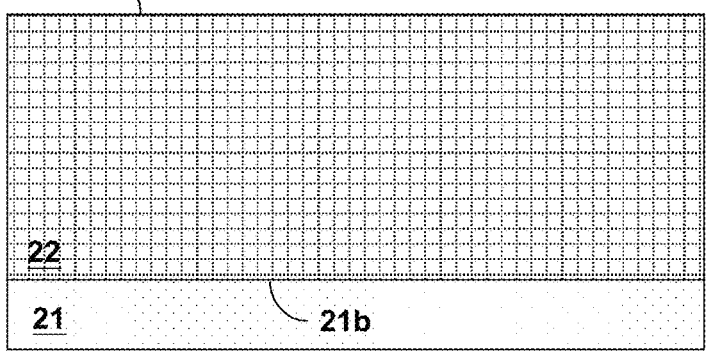
FIG. 5A to FIG. 5H show cross-section diagrams of a manufacturing method fora power device according to an embodiment of the present invention.

Please refer to FIG. 5A to FIG. 5H, which show cross-section diagrams of a manufacturing method for a power device 200 according to an embodiment of the present invention. As shown in FIG. 5A, first, a substrate 21 is provided. The substrate 21 is, for example but not limited to, a P conductivity type or an N conductivity type silicon substrate. Next, As shown in FIG. 5B, a semiconductor layer 21' is formed on the substrate 21, and the semiconductor layer 21' has a top surface 21a and a bottom surface 21b that is opposite to the top surface 21a in the vertical direction (as indicated by the direction of the dashed arrow in FIG. 5B). The semiconductor layer 21', for example, is formed on the substrate 21 by an epitaxial growth process step, or, a part of the substrate 21 is used as the semiconductor layer 21'. The semiconductor layer 21' can be formed by any method known to a person having ordinary skill in the art, so the details thereof are not redundantly explained here.

Still referring to FIG. 5B, next, a well 22 is formed in the semiconductor layer 21'. The well 22 is located below and in contact with the top surface 21a in the vertical direction. The well 22 has a first conductivity type. The well 22 can be formed by, for example but not limited to, an ion implantation process step which implants first conductivity type impurities in the semiconductor layer 21' in the form of accelerated ions (as indicated by the downward dashed arrows in FIG. 5B), to form the well 22.

Figure 5C:
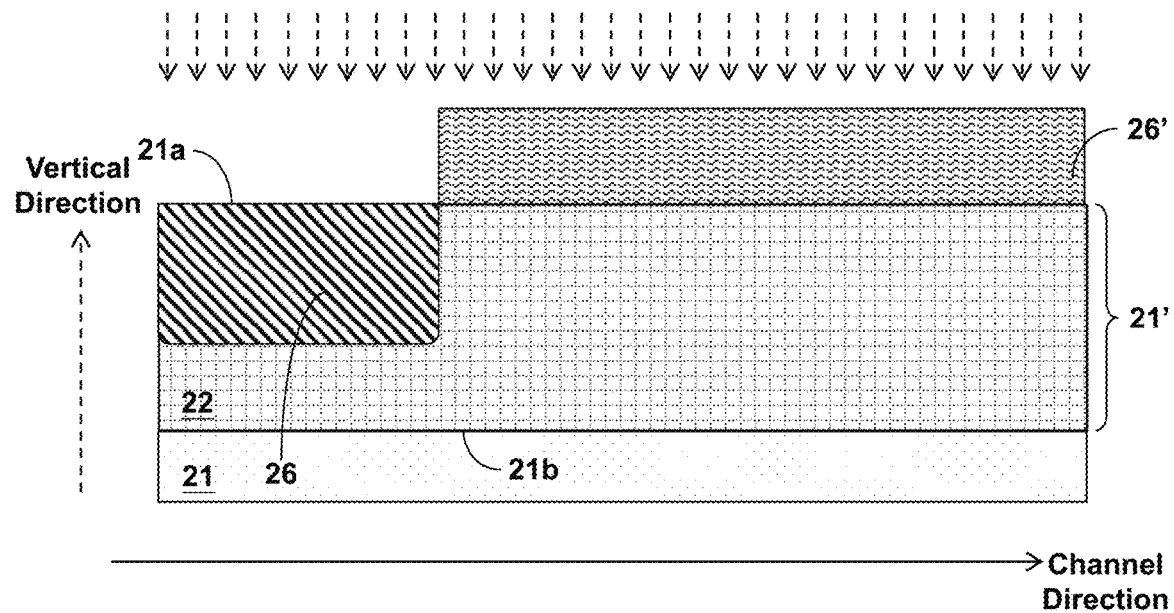

Next, please refer to FIG. 5C. A body region 26 is formed in the semiconductor layer 21'. The body region 26 is located below and in contact with the top surface 21a. The body region 26 is in contact with the well 22 in a channel direction (as indicated by the solid arrow in FIG. 5C). A part of the body region 26 is located vertically below and in contact with a gate 27 which will be formed later, to serve as an inversion current channel in an ON operation of the power device 200. The body region 26 has a second conductivity type. The body region 26 can be formed by, for example but not limited to, a lithography process step and an ion implantation process step, wherein the lithography process step includes forming a photo-resist layer 26' as a mask, and the ion implantation process step includes doping second conductivity type impurities in the well 22 of the semiconductor layer 21' in the form of accelerated ions, to counter dope the defined region in the well 22, so as to form the body region 26.

Figure 5D:
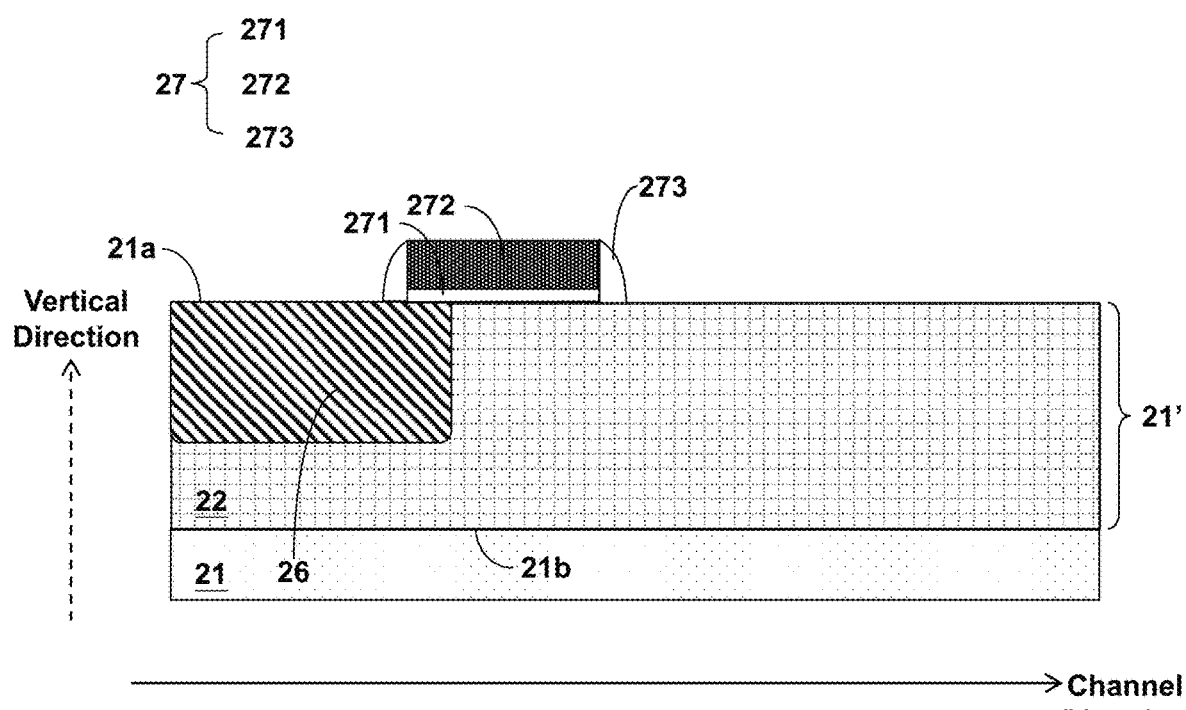

Next, please refer to FIG. 5D. A gate 27 is formed on the top surface 21a of the semiconductor layer 21'. A part of the body region 26 is located vertically below and in contact with the gate 27, to serve as an inversion current channel in an ON operation of the power device 200. And, a part of the well 22 which is in contact with the body region 26 is located vertically below the gate 27, to serve as a drift current channel in the ON operation of the power device 200.

The gate 27 includes a dielectric layer 271 in contact with the top surface 21a, a conductive layer 272 on the dielectric layer 271, and a spacer layer 273 having electrical insulation properties. The gate 27 turns ON and turns OFF the power device 200 according to a control signal applied to the gate 27.

Figure 5E:
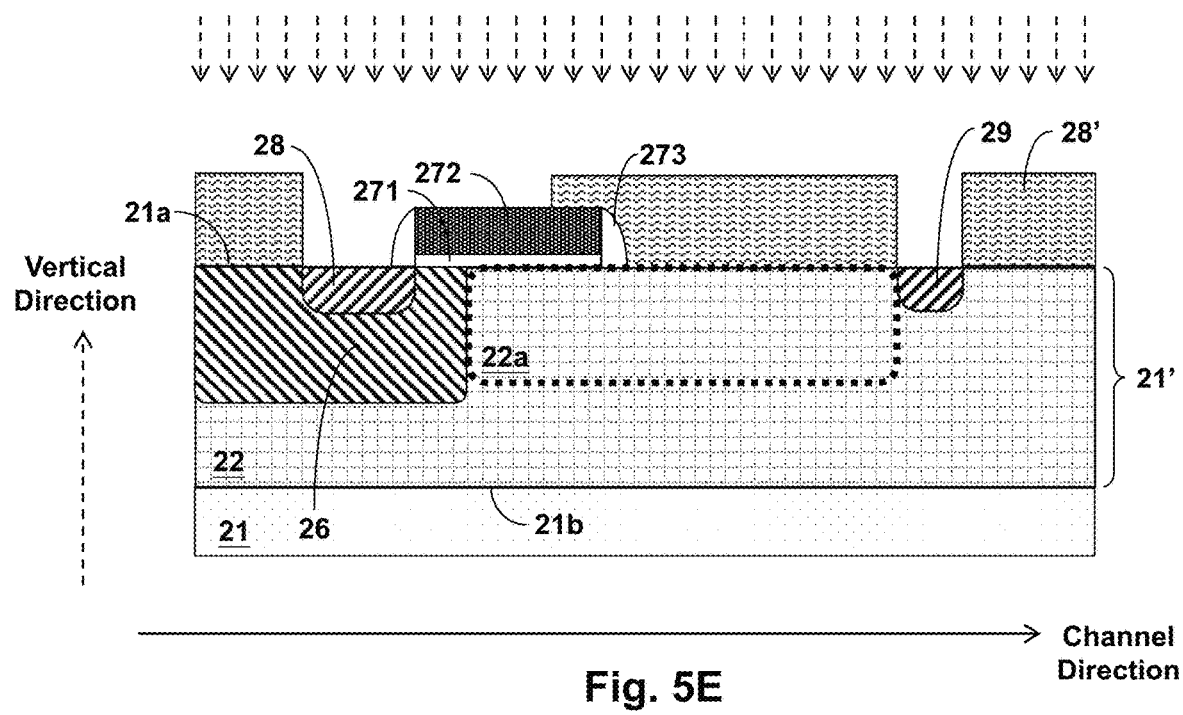

Next, please refer to FIG. 5E. Each of the source 28 and the drain 29 is formed below and in contact with the top surface 21a. The source 28 and the drain 29 are located below and outside two sides of the gate 27 respectively. The side of the gate 27 which is closer to the source 28 is a source side and the side of the gate 27 which is closer to the drain 29 is a drain side, wherein the source 28 is located in the body region 26, and the drain 29 is located in the well 22 outside the drain side. A drift region 22a is formed in the well 22 between the drain 29 and the body region 26 in the channel direction, and is in contact with the top surface 21a, to separate the drain 29 from the body region 26 and to serve as a drift current channel in the ON operation of the power device 200. The source 28 and the drain 29 can be formed by, for example but not limited to, a lithography process step and an ion implantation process step, wherein the lithography process step includes forming a photo-resist layer 28' which together with the gate 27 form a mask, and the ion implantation process step includes doping first conductivity type impurities in the body region 26 and the well 22 in the form of accelerated ions, so as to form the source 28 and the drain 29, respectively.

Figure 5F:
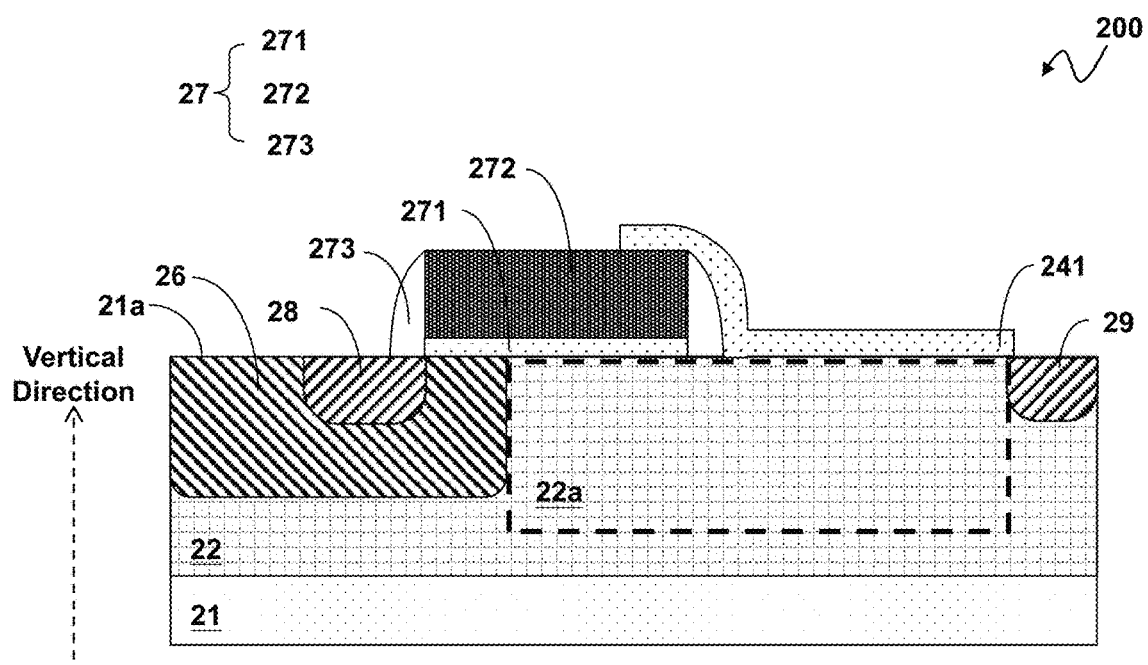

Next, please refer to FIG. 5F. A first SAB layer 241 is formed on the top surface 21a and is located between the gate 27 and the drain 29, wherein a part of the well 22 is located vertically below and in contact with the first SAB layer 241. The first SAB layer 241 can be formed by, for example but not limited to, a deposition process step, a lithography process step and an etching process step. The first SAB layer 241 can be formed in the high voltage region and in the low voltage region by one same process step at the same time.

Figure 5G:
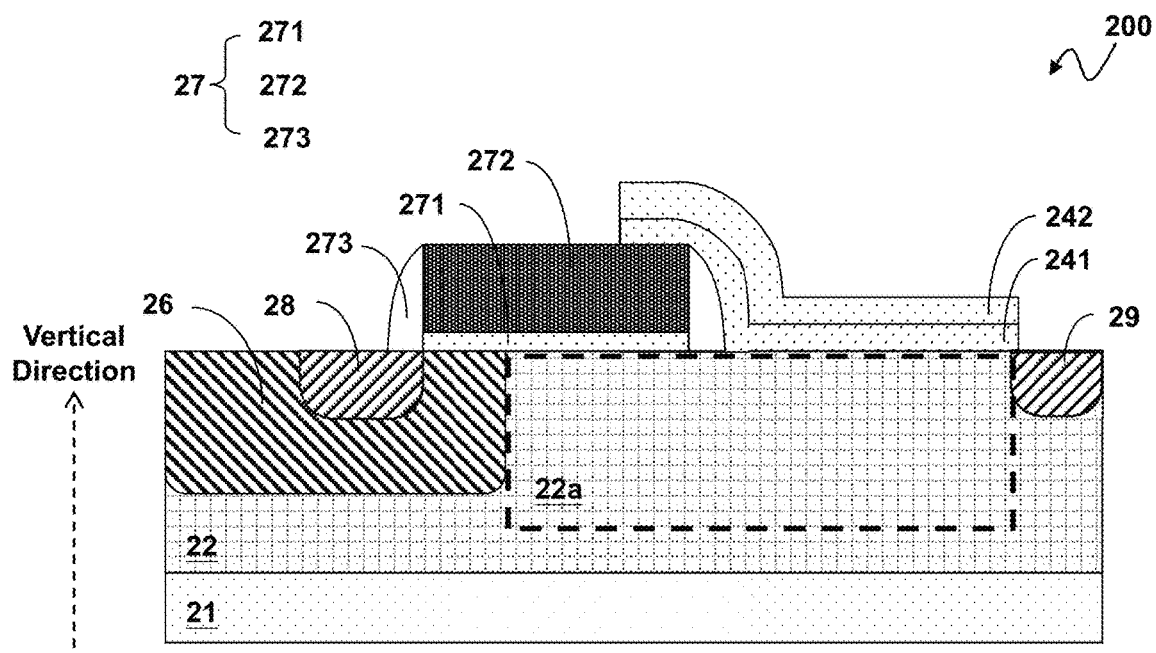

Next, please refer to FIG. 5G. A second SAB layer 242 is formed vertically above and in contact with the first SAB layer 241. The second SAB layer 242 can be formed by, for example but not limited to, a deposition process step, a lithography process step and an etching process step. Note that the second SAB layer 242 is only formed in the high voltage region but is not formed in the low voltage region.

Figure 5H:
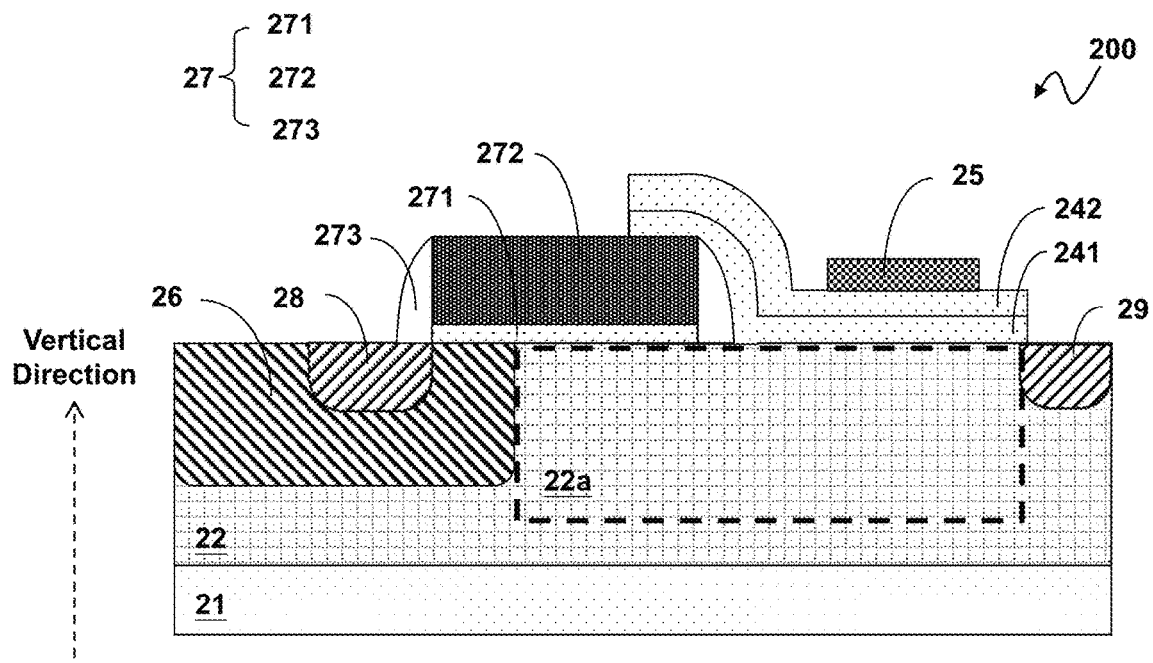

Next, please refer to FIG. 5H. A salicide layer 25 is formed on and in contact with the second SAB layer 242. The salicide layer 25 is conductive. The salicide layer 25 serves to be electrically connected to a predetermined voltage level, so as to relieve an electric field distribution during operation of the power device 200. The salicide layer 25 can be formed by, for example but not limited to, a deposition process step, a lithography process step and an etching process step.

The present invention has been described in considerable detail with reference to certain preferred embodiments thereof. It should be understood that the description is for illustrative purpose, not for limiting the broadest scope of the present invention. Those skilled in this art can readily conceive variations and modifications within the spirit of the present invention. The various embodiments described above are not limited to being used alone; two embodiments may be used in combination, or a part of one embodiment may be used in another embodiment. For example, other process steps or structures, such as a metal silicide layer, may be added. For another example, the lithography process step is not limited to the mask technology but it can also include electron beam lithography, immersion lithography, etc. Therefore, in the same spirit of the present invention, those skilled in the art can think of various equivalent variations and various combinations, and there are many combinations thereof, and the description will not be repeated here. The scope of the present invention should include what are defined in the claims and the equivalents.

What is claimed is:

1. A power device, comprising:
   a semiconductor layer, which is formed on a substrate, and has a top surface;
   a well having a first conductivity type, which is formed in the semiconductor layer, wherein the well is located below and in contact with the top surface;
   a body region having a second conductivity type, which is formed in the semiconductor layer, wherein the body region is located below and in contact with the top surface, and wherein the body region is in contact with the well in a channel direction;
   a gate, which is formed on the top surface, wherein a part of the body region is located vertically below and in contact with the gate, to serve as an inversion current channel in an ON operation of the power device, and wherein a part of the well which is in contact with the body region is located vertically below the gate, to serve as a drift current channel in the ON operation of the power device;
   a source and a drain having the first conductivity type, which are formed below and in contact with the top surface, wherein the source and the drain are located below and outside two sides of the gate respectively, wherein the side of the gate which is closer to the source is a source side and the side of the gate which is closer to the drain is a drain side, and wherein the source is located in the body region, and the drain is located in the well outside the drain side;
   a first salicide block (SAB) layer, which is formed on the top surface and which is located between the gate and the drain, wherein a part of the well is located vertically below and in contact with the first SAB layer; and
   a second SAB layer, which is formed vertically above and in contact with the first SAB layer;
   wherein the substrate has a low voltage region and a high voltage region, wherein the power device is formed in the high voltage region;
   wherein a plurality of metal oxide semiconductor (MOS) devices are formed in the low voltage region;
   wherein the first SAB layer is formed in the low voltage region and the high voltage region; and
   wherein the second SAB layer is formed in the high voltage region and is not located in the low voltage region.

2. The power device of claim 1, further comprising:
   a salicide layer which is conductive, which is formed on and in contact with the second SAB layer, wherein the salicide layer serves to be electrically connected to a predetermined voltage level, so as to relieve an electric field distribution during operation of the power device.

3. The power device of claim 1, wherein the power device is a laterally diffused metal oxide semiconductor (LDMOS) device.

4. The power device of claim 1, wherein a composite layer of the first SAB layer superimposed with the second SAB layer has a dielectric constant lower than 3.9.

5. The power device of claim 1, wherein a composite layer of the first SAB layer superimposed with the second SAB layer has a dielectric constant higher than 3.9.

6. The power device of claim 1, wherein a composite layer of the first SAB layer superimposed with the second SAB layer has a dielectric constant equal to 3.9.

7. The power device of claim 1, wherein a thickness of the second SAB layer is determined according to a required OFF breakdown voltage of the power device.

8. A manufacturing method of a power device, comprising:
   forming a semiconductor layer on a substrate, wherein the semiconductor layer has a top surface;
   forming a well in the semiconductor layer, wherein the well has a first conductivity type, wherein the well is located below and in contact with the top surface;
   forming a body region in the semiconductor layer, wherein the body region has a second conductivity type, wherein the body region is located below and in contact with the top surface, and wherein the body region is in contact with the well in a channel direction;
   forming a gate on the top surface, wherein a part of the body region is located vertically below and in contact with the gate, to serve as an inversion current channel in an ON operation of the power device, and wherein a part of the well which is in contact with the body region is located vertically below the gate, to serve as a drift current channel in the ON operation of the power device;
   forming a source and a drain below and in contact with the top surface, wherein each of the source and the drain has the first conductivity type, wherein the source and the drain are located below and outside two sides of the gate respectively, wherein the side of the gate which is closer to the source is a source side and the side of the gate which is closer to the drain is a drain side, and wherein the source is located in the body region, and the drain is located in the well outside the drain side;
   forming a first salicide block (SAB) layer on the top surface, wherein the first SAB layer is located between the gate and the drain, wherein a part of the well is located vertically below and in contact with the first SAB layer; and
   forming a second SAB layer vertically above and in contact with the first SAB layer;
   wherein the substrate has a low voltage region and a high voltage region, wherein the power device is formed in the high voltage region;
   wherein a plurality of metal oxide semiconductor (MOS) devices are formed in the low voltage region;
   wherein the first SAB layer is formed in the low voltage region and the high voltage region; and
   wherein the second SAB layer is formed in the high voltage region and is not located in the low voltage region.

9. The manufacturing method of claim 8, further comprising:
   forming a salicide layer on and in contact with the second SAB layer, wherein the salicide layer is conductive, wherein the salicide layer serves to be electrically connected to a predetermined voltage level, so as to relieve an electric field distribution during operation of the power device.

10. The manufacturing method of claim 8, wherein the power device is a laterally diffused metal oxide semiconductor (LDMOS) device.

11. The manufacturing method of claim 8, wherein a composite layer of the first SAB layer superimposed with the second SAB layer has a dielectric constant lower than 3.9.

12. The manufacturing method of claim 8, wherein a composite layer of the first SAB layer superimposed with the second SAB layer has a dielectric constant higher than 3.9.

13. The manufacturing method of claim 8, wherein a composite layer of the first SAB layer superimposed with the second SAB layer has a dielectric constant equal to 3.9.

14. The manufacturing method of claim 8, wherein a thickness of the second SAB layer is determined according to a required OFF breakdown voltage of the power device.

* * * * *